United States Patent [19]

Thomas

[11] Patent Number: 5,288,203

[45] Date of Patent: Feb. 22, 1994

[54] LOW PROFILE FAN BODY WITH HEAT TRANSFER CHARACTERISTICS

[76] Inventor: Daniel L. Thomas, 1299 San Tomas Aquino Rd., Ste. 212, San Jose, Calif. 95117

[21] Appl. No.: 965,654

[22] Filed: Oct. 23, 1992

[51] Int. Cl.$^5$ .............................................. F04D 29/58
[52] U.S. Cl. .................................... 415/178; 415/176; 415/213.1; 415/214.1; 165/124; 165/126; 361/694
[58] Field of Search ............... 415/178, 175, 176, 177, 415/213.1, 214.1, 220; 165/124, 126; 361/384

[56] References Cited

U.S. PATENT DOCUMENTS

| | | |
|---|---|---|
| 3,686,533 | 8/1972 | Garnier et al. . |
| 4,194,556 | 3/1980 | Watanabe et al. ................... 415/220 |
| 4,233,644 | 11/1980 | Hwang et al. . |
| 4,489,363 | 12/1984 | Goldberg . |
| 4,541,004 | 9/1985 | Moore . |
| 4,546,405 | 10/1985 | Hultmark et al. . |
| 4,611,238 | 9/1986 | Lewis et al. . |
| 4,620,216 | 10/1986 | Horvath . |
| 4,639,829 | 1/1987 | Ostergren et al. . |
| 4,662,830 | 5/1987 | Pottebaum ........................ 361/384 |
| 4,682,651 | 6/1987 | Gabuzda . |
| 4,715,430 | 12/1987 | Arnold . |
| 4,733,293 | 3/1988 | Gabuzda . |
| 4,970,579 | 11/1990 | Aridt et al. . |
| 5,191,230 | 3/1993 | Heung ............................... 361/384 |

FOREIGN PATENT DOCUMENTS

| | | | |
|---|---|---|---|
| 2743708 | 4/1979 | Fed. Rep. of Germany ....... 361/384 |
| 63-113460 | 7/1988 | Japan .................................. 361/384 |
| 286900 | 11/1990 | Japan .................................. 361/384 |
| 229492 | 10/1991 | Japan .................................. 361/384 |

Primary Examiner—Edward K. Look
Assistant Examiner—Michael S. Lee
Attorney, Agent, or Firm—Flehr, Hohbach, Test, Albritton & Herbert

[57] ABSTRACT

An electronic component cooling low profile fan body with favorable heat transfer characteristics is disclosed. A fan, positioned in the body, includes a number of blades circumferentially formed around a central axis. The blades establish an axial blade depth region in reference to the central axis. The low profile fan body includes a frame supporting the fan. In one embodiment of the invention, the heat transfer body includes a pressure differential surface formed around the outer perimeter of the fan blades within a first segment of the axial blade depth region. An interface surface for connection to the electronic component is positioned opposite of the fan frame. A number of heat transfer devices are disposed between the frame and the interface surface, such that the heat transfer devices are positioned within a second segment of the axial blade depth region. In an alternate embodiment of the invention, heat transfer devices are disposed between the frame and the interface surface, without a pressure differential surface, along the entire axial blade depth region. The configuration of the heat transfer devices allows them to function as both a heat transfer surface and a pressure differential surface.

37 Claims, 7 Drawing Sheets

LOW PROFILE FAN BODY WITH HEAT TRANSFER CHARACTERISTICS

BRIEF DESCRIPTION OF THE INVENTION

This invention relates generally to the cooling of electronic components. This invention more particularly relates to a low profile fan body with heat transfer characteristics which is positioned on an electronic component which is to be cooled.

BACKGROUND OF THE INVENTION

Semiconductors are continuously diminishing in size. Corresponding to this size reduction is an increase in the power densities of the semiconductors. This, in turn, creates heat proliferation problems which must be resolved. The prior art is replete with devices which are used to remove heat from semiconductors. For example, air-cooled finned heat sinks, thermosiphons, fans, plungers, and liquid-cooled heat sinks are typically employed in the prior art. A salient shortcoming with such devices is that they have a relatively large vertical profile. As a result, they are difficult to use in compact electronic equipment such as palm, notebook, lap and desktop computers. The size of prior art cooling devices also discourages their utilization in other contexts such as for cooling power supplies. Thus, it would be highly advantageous to provide an efficient cooling device without the size limitations associated with prior art devices.

Prior art attempts have been made to cool electronic devices (semiconductors, power supplies and analogous heat generating devices) by combining heat sinks with fans. These attempts have encountered a number of difficulties. First, the combination of these elements has previously rendered a high profile device. In addition, prior art combinations of fans and heat sinks have not resulted in optimal heat transfer characteristics. For example, prior art fans use either a full venturi around the fan blades or eliminate the venturi altogether. When the venturi is eliminated altogether by placing a fan directly in a heat sink, it is difficult to obtain optimal air movement over the heat sink. If a full venturi is used, it is difficult to reduce the vertical fan profile. It would be advantageous to develop a device which enjoys the air movement benefits associated with a venturi, but which is not hindered by the concomitant vertical profile problem associated with a venturi.

OBJECTS AND SUMMARY OF THE INVENTION

It is a general object of the present invention to provide an electronic component cooling device.

It is a related object of the invention to provide an electronic component cooling device which has a low profile body with favorable heat transfer properties.

It is another object of the invention to provide an electronic component cooling device which can be used in compact electronic equipment such as palm, notebook, lap, and desktop computers.

It is a related object of the invention to provide an electronic component cooling device which can be efficiently used for power supplies and other heat generating devices.

It is another object of the invention to provide an electronic component cooling device which exploits the air movement benefits of a venturi while withstanding the vertical profile limitations associated with prior art venturies.

These and other objects are obtained by an electronic component cooling low profile fan body with favorable heat transfer characteristics. A fan, positioned in the body, includes a number of blades circumferentially formed around a central axis. The blades establish an axial blade depth region in reference to the central axis. The low profile fan body includes a frame supporting the fan. In one embodiment of the invention, the heat transfer body includes a pressure differential surface formed around the outer perimeter of the fan blades within a first segment of the axial blade depth region. An interface surface for connection to the electronic component is positioned opposite of the fan frame. A number of heat transfer devices are disposed between the frame and the interface surface, such that the heat transfer devices are positioned within a second segment of the axial blade depth region. In an alternate embodiment of the invention, heat transfer devices are disposed between the frame and the interface surface, without a pressure differential surface, along the entire axial blade depth region. The configuration of the heat transfer devices allows them to function as both a heat transfer surface and a pressure differential surface.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
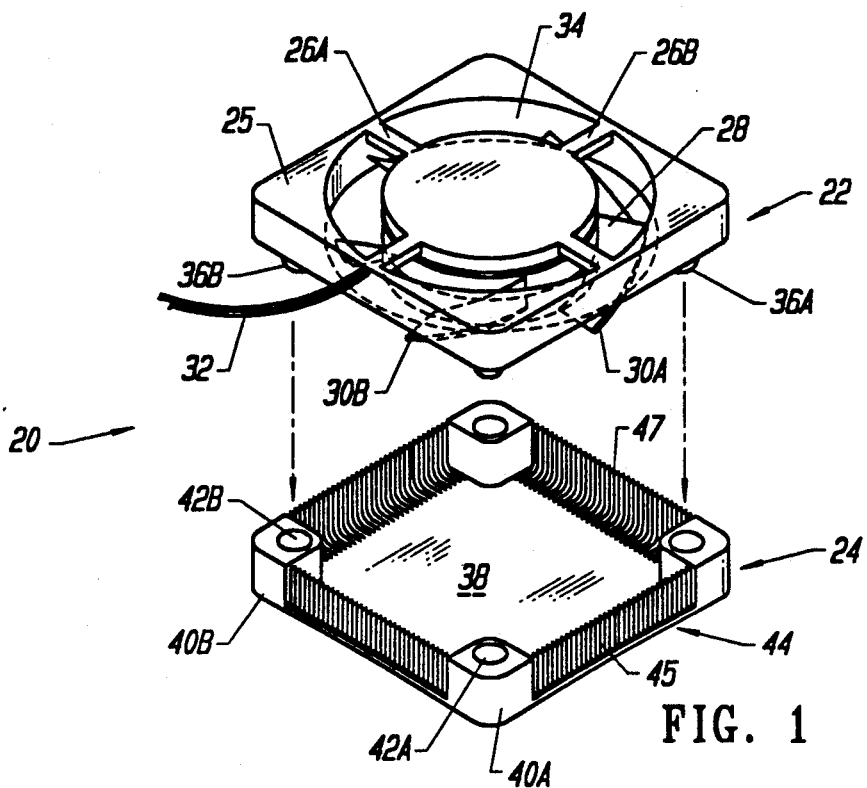
FIG. 1 is an exploded view of the fan-frame member and the fan-base member of the low profile fan body of the invention.

FIG. 1 provides an exploded view of a low profile fan body with heat transfer characteristics 20, in accordance with the invention. The low profile fan body 20 includes a fan-frame member 22 and a fan-base member 24. In this embodiment, the fan-frame member 22 includes a fan-frame member body 25 and a number of struts 26 to support fan 28, which includes a motor and corresponding circuitry. Fan 28 includes a number of fan blades 30 and is energized by power line 32. As used herein, the term "fan" means any fluid movement device. The fan-frame member 22 preferably includes interconnection posts 36 for coupling with the fan-base 24.

As will be more fully described below, in this embodiment of the invention, the fan-frame member 22 includes a discrete air pressure differential surface 34 which extends only a fraction of the axial depth defined by the fan blades 30. Thus, the fan blades 30 extend into the fan-base member 24.

The fan-base member 24 includes an interface surface 38. At the corners of the interface surface 38 are vertical support members 40 defining post receptacles 42. On the outer perimeter of the interface surface 38 is an optimized heat transfer surface 44, which in this embodiment comprises a number of finely pitched posts 45, defining slots 47 therebetween.

Figure 2:
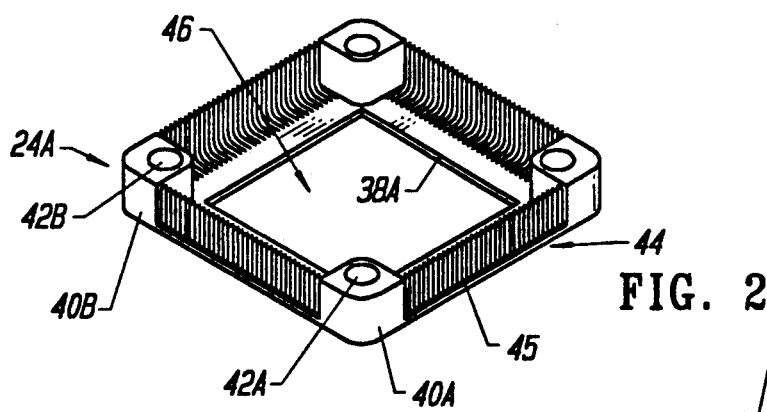
FIG. 2 is a perspective view of the fan-base member of the invention; in this embodiment, the fan-base member interface surface is a perimeter interface surface.

FIG. 2 depicts an alternate embodiment 24A of the fan-base member 24. In this embodiment, the interface surface 38A is in the form of a perimeter surface. Thus, the interface surface 38A forms a large fan-base aperture 46. As will be more fully described below, a fan-base member 24 is positioned on a heat generating electronic component. In the embodiment of FIG. 2, the fan-base aperture 46 allows direct air movement over a heat generating electronic component.

Figure 3:
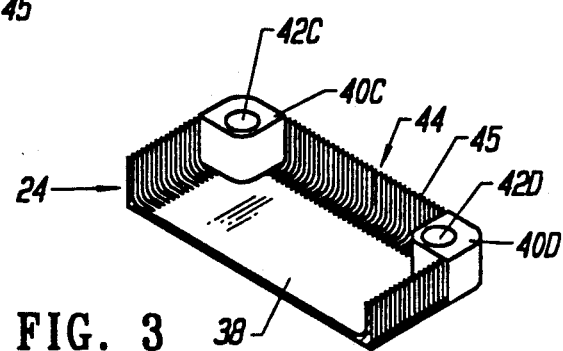
FIG. 3 is an enlarged cut away view of the fan-base member of the invention.

FIG. 3 provides a cut away view of the fan-base member 24 of FIG. 1. The figure clearly depicts the solid interface surface 38.

Figure 4:
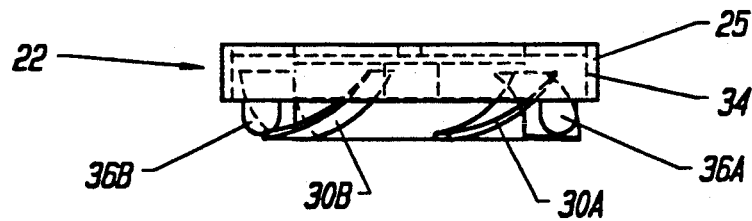
FIG. 4 is a side view of the fan-frame member showing a pressure differential surface formed therein.

FIG. 4 depicts a side view of one embodiment of the fan-frame member 22 of the invention. The figure also shows, in phantom, an air pressure differential surface 34. As shown in FIGS. 1 and 4, the air pressure differential surface 34 is a vertical surface formed around the outer perimeter of the fan blades 30. In this embodiment, the air pressure differential surface 34 is the same vertical height as the fan-frame member body 25. As depicted in FIG. 4, the fan blades 30 have a greater axial height than the fan-frame member body 25 and its corresponding air pressure differential surface 34. Consequently, the fan blades 30 extend below the fan-frame member 22.

Figure 5:
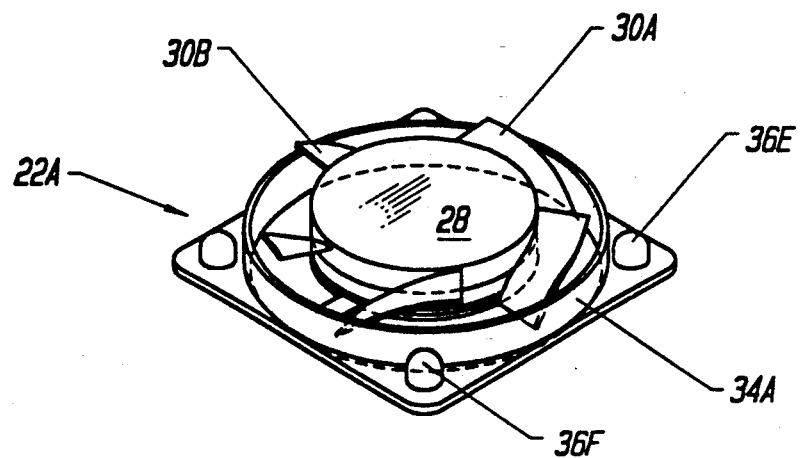
FIG. 5 is a perspective view of a shallow fan-frame member with a protruding pressure differential surface extending therefrom.

An alternate embodiment 22A of the fan-frame member of the invention is depicted in FIG. 5. In this embodiment, the fan-frame member body 25A has a very thin vertical profile. The fan-frame member body 25A supports a protruding air pressure differential surface 34A. In a preferable embodiment, the air pressure differential surface 34A has a vertical, or axial, height which is less than that of the fan blades 30. In other words, as in the case of the fan-frame member 22 of FIG. 4, the fan blades 30 extend beyond the axial depth of the air pressure differential surface 34.

Figure 6:
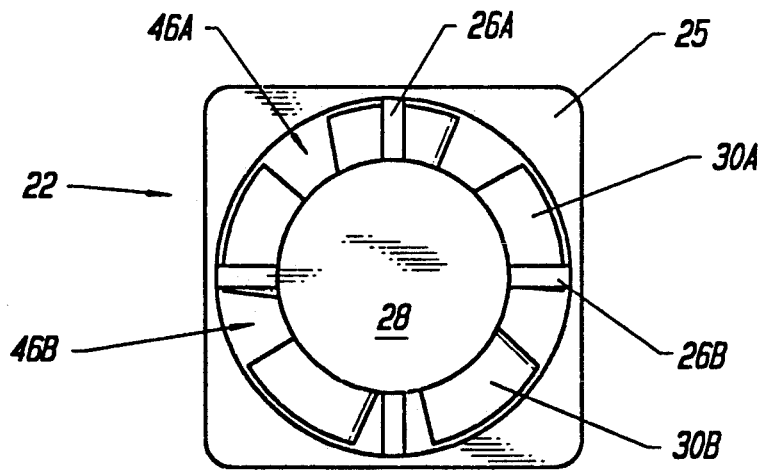
FIG. 6 is a top view of the fan-frame member.

FIG. 6 is a top view of the fan-frame member 22. Note that the fan-frame member 22 forms large fan-frame apertures 46. Fan 28 provides axial air flow through the fan-frame apertures 46.

Figure 7:
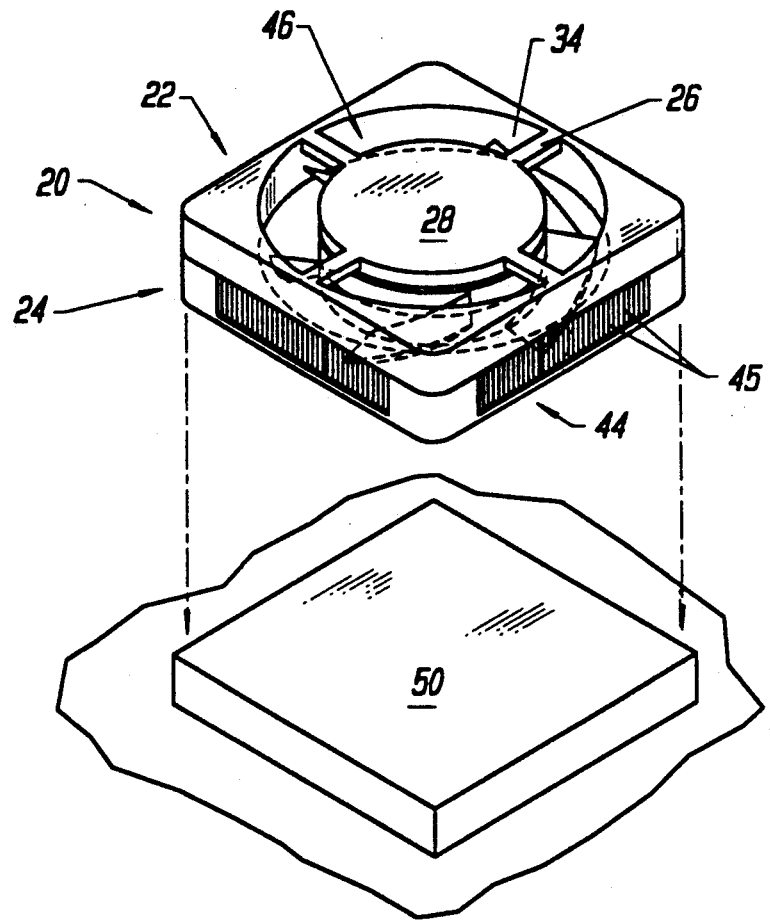
FIG. 7 is a perspective view of the fan-frame member and the fan-base member attached to form a low profile fan body which is used to cool an electronic component.

FIG. 7 is an exploded view showing the invention's low profile fan body 20 being positioned on a heat generating electronic component 50. The apparatus 20 efficiently removes heat from the electronic component 50 in the following manner. The fan 28 produces a low pressure region adjacent to the optimized heat transfer surface 44 and a high pressure region at the fan apertures 46. As a result, ambient air is blown in through the optimized heat transfer surface 44 toward the low pressure region created by the fan 28. The fan blades 30 then transport the air to the high pressure region near the fan apertures 46, at which point it blows out into the ambient environment.

The apparatus 20 of the present invention departs from prior art fan bodies in a number of respects. First, as previously stated, the fan blades 30 extend below the air pressure differential surface 34. Thus, the air pressure differential surface 34 only occupies a segment of the axial blade depth region. Second, the optimized heat transfer surface is also in the axial blade depth region. This configuration allows for a low profile fan body with favorable heat transfer properties. The favorable heat transfer properties are produced by the air pressure differential surface 34. Although the invention merely utilizes a partial air pressure differential surface 34, effective heat transfer properties are still obtained because the fan blades 30 cause air to circulate at the axial base of the fan blades 30. This circulating air is in close contact with the interior portion of the optimized heat transfer surface 44, which thereby serves to force the air in an axial direction.

An important functional attribute of the present invention is that both the pressure differential surface 34 and the optimized heat transfer surface 44 are positioned within, and adjacent to, the axial blade depth region. Thus, a low profile fan body 20 can be achieved. Moreover, favorable heat transfer characteristics are realized because the pressure differential surface is acting as a partial venturi surface, while the heat transfer surface is simultaneously serving as a heat transfer surface and a partial venturi surface. One skilled in the art will recognize that any combination of air pressure differential surface axial lengths and optimized heat transfer surface axial lengths may be employed within the ambit of the invention.

Note that in the embodiment of FIG. 7, the fine pitch of the slots 47 within the optimized heat transfer surface 44 serve to prevent fine particulate from collecting on the fan blades 30 or the fan 28. In other words, the fine particulate accumulates on the posts 45 and slots 47, rather than the fan blades 30 or the fan motor 28. Particulate can be readily removed from the posts 45 and slots 47.

Figure 8:
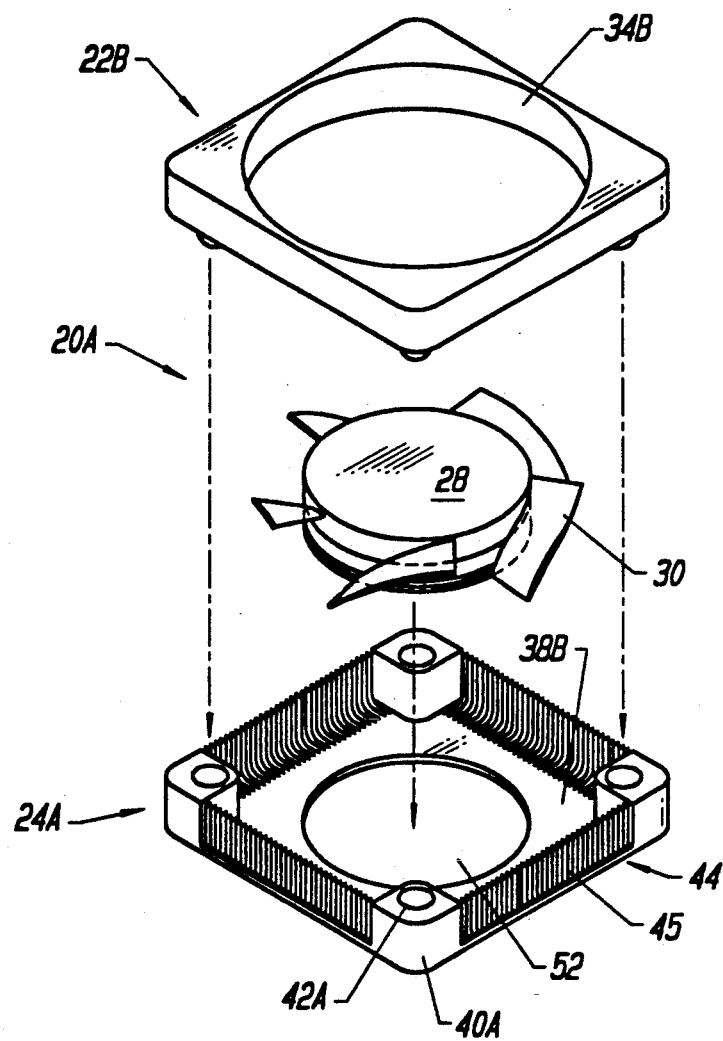
FIG. 8 is an exploded view depicting a fan motor which is positionable within a fan-base member which includes an aperture for receiving the fan motor.

FIG. 8 provides an alternate embodiment 20A of the apparatus of the invention. In this embodiment, the fanbase member 24A has an interface surface 38B which forms a fan receptacle 52 for receiving fan 28. The fan-base member 24A does not require a fan receptacle, rather the fan 28 may be simply mounted on the interface surface 38B, or it may be mounted on a plateau formed in the interface surface 38B.

The fan-frame member 22B includes an air pressure differential surface 34B. This embodiment of the invention operates in a manner consistent with the embodiment of FIG. 7. This embodiment of the invention may also be practiced without the use of the fan-frame member 22B. In such an embodiment, only the heat transfer surface 44 is within the axial blade depth region. Thus, as will be further described below, the heat transfer surface 44 simultaneously serves as an air pressure differential surface and a heat transfer surface.

Figure 9:
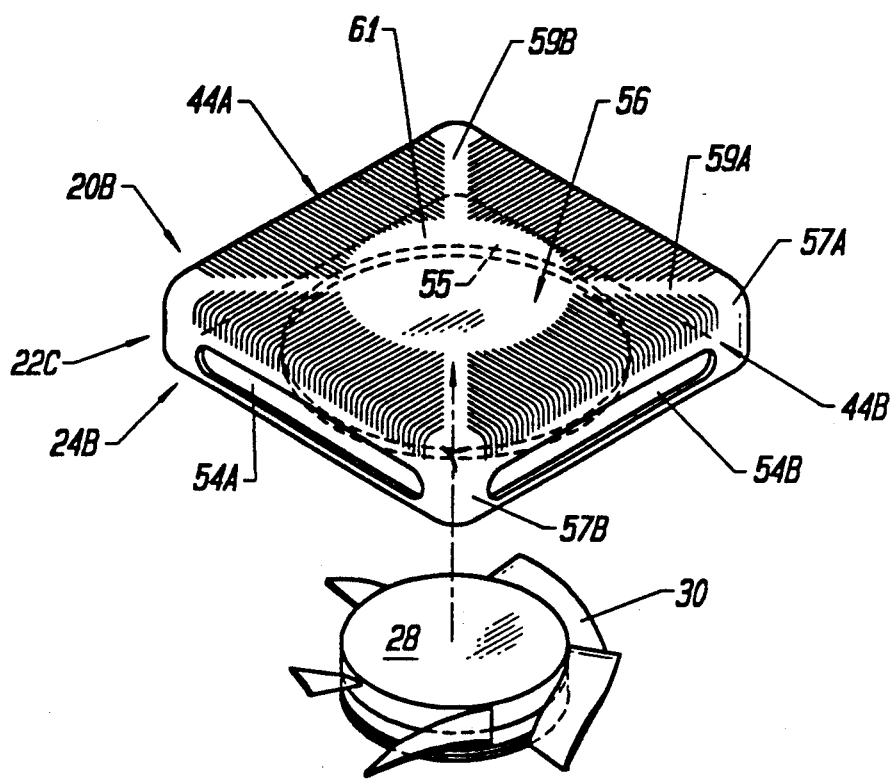
FIG. 9 is an exploded view depicting a fan-frame member with an optimized heat transfer surface which is positionable with a fan-base member which includes large air flow apertures.

FIG. 9 provides still another embodiment 20B of the apparatus of the invention. This embodiment departs from the previous embodiments in that it does not include a discrete air pressure differential surface. Rather, the optimized heat transfer surface assumes this function, as will be described below.

As depicted in the figure, the fan-frame member 22C and the fan-base member 24B are formed as a unitary fan body 20B. The fan-base member 24B includes large elongated apertures 54. The fan-base member 24B also includes a base surface 55 which defines a fan insertion aperture 56. Fan 28 is placed through the fan insertion aperture 56, and is secured by conventional mechanisms. The fan-frame member 22C includes horizontal optimized heat transfer surfaces 44A, which may extend into vertical optimized heat transfer surfaces 44B. Variations of this design are feasible. For instance, the horizontal heat transfer surfaces 44 may be limited to the top of the fan frame member 22C, or the heat transfer surfaces 44 may extend to the base of the fan-base member 24B into the base surface 55, effectively forming a cage-like structure.

In preferable operation of the apparatus of FIG. 9, air enters through the optimized heat transfer surfaces 44A and 44B and leaves through elongated apertures 54. Note that in this embodiment, the optimized heat transfer surface 44 serves as both a heat transfer surface and a pressure differential surface. That is, due to the proximity of the fan frame 22C to the fan blades 30, the heat transfer surface can be exploited as a pressure differential surface. Also note that in this embodiment, the fan 28 is effectively positioned directly on the heat source and the heat transfer surface 44 is above the fan. In the prior art, heat transfer surfaces are coupled directly to a heat source and a fan is positioned above the heat transfer surfaces.

With the structure of FIG. 9, heat produced by a heat generating device is conducted from the base 55 through vertical heat conduction limbs 57. From the vertical heat conduction limbs 57, the heat is conducted through heat conduction channels 59 into the central heat conduction region 61 formed on the top of the fan-frame member 22C. Note that the vertical heat conduction limbs 57, heat conduction channels 59, and central heat conduction region 61 each have peripheral contact with a heat transfer surface 44, and thereby transfer heat to the heat transfer surface for efficient heat exchange (removal).

In an alternate embodiment of the invention, fan 28 is directly mounted on the underside of heat conduction region 61. A receptacle may be formed within the heat conduction region 61 or a plateau may be formed to mount the fan 28.

Figure 10:
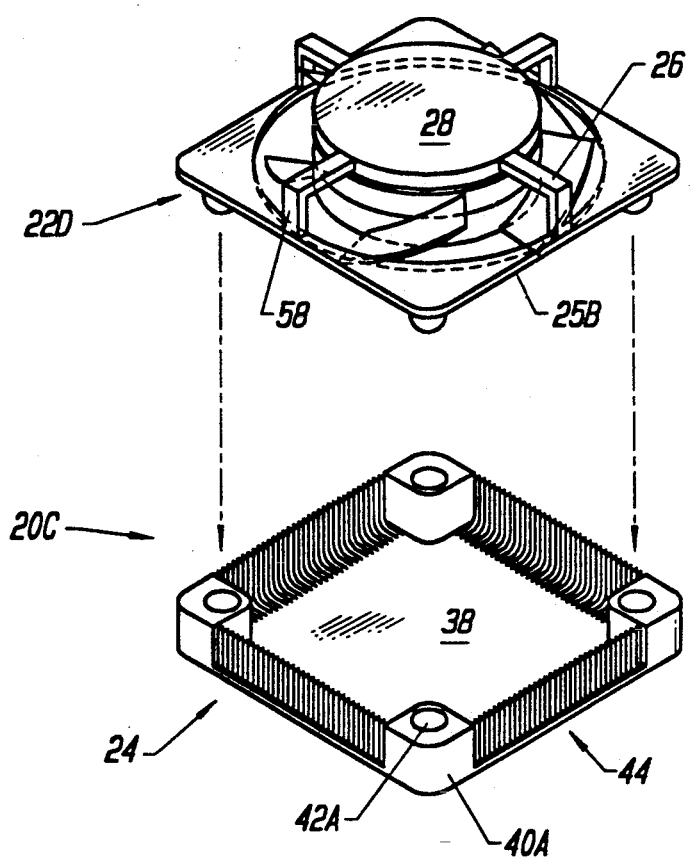
FIG. 10 is an exploded view of a fan-base member and a fan-frame member supporting a fan within the fan-base region.

FIG. 10 provides still another embodiment of an apparatus in accordance with the present invention. The apparatus 20C includes a fan base 24 of the type previously described in relation to FIG. 1. However, in this device an alternate fan-frame 22D is employed. As depicted, the fan-frame 22D has a thin fan-frame body 25B. Vertical supports 58 are positioned on the fan-frame body 25B to support struts 26, which, in turn, support fan 28. In this embodiment, the fan blades 30 extend into the axial region defined by the optimized heat transfer surfaces 44. As in the previous embodiment, the optimized heat transfer surfaces 44 have the dual function of heat transfer surfaces and air pressure differential surfaces. The finely pitched posts 45 are closely positioned next to the fan blades 30. The density of the finely pitched posts 45 allow them to serve as a pressure differential surface, while still maintaining their heat transfer characteristics.

Figure 11:
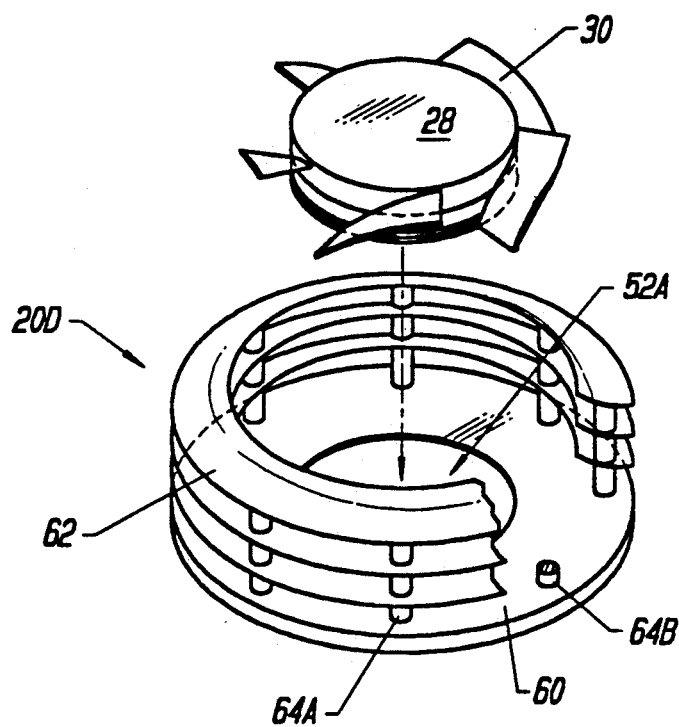
FIG. 11 is a perspective view of a low profile fan body with a plurality of vertically displaced heat transfer rings which simultaneously serve as a heat transfer surface and a pressure differential surface.

FIG. 11 provides another embodiment of a low profile fan body 20D with favorable heat transfer characteristics. The body 20D includes a circular foundation 60 which defines a fan receptacle 52A. As depicted, a fan 28 is positioned within the fan receptacle 52A. The body 20D also includes a number of studs 64 which support a number of vertically displaced rings 62, which in combination constitute an optimized heat transfer surface 44 and air pressure differential surface 34. In other words, due to the geometric proximity of the vertically displaced rings 62 to one another and to the fan blades 30, they serve the dual purpose of forming an optimized heat transfer surface and an air pressure differential surface. In a preferable embodiment, there are between 10 and 20 vertically displaced rings 62, optimally, there are approximately 15 such rings. The distance between rings is preferably between 0.25 millimeters and 1.0 millimeters, preferably the distance is approximately 0.7 millimeters. Preferably, each ring 62 has a geometry that enhances its pressure differential capacity. In other words, a ring 62 preferably includes an arc-like cross-section.

Note that in FIG. 11, studs 64 should be formed of a heat conductive material, preferably a metallic material, and therefore forms a heat conduction path from the circular foundation 60, through the studs 64, and into the rings 62.

Returning to FIG. 1, the fan-base member 24 is preferably formed from a highly conductive material such as aluminum. The aluminum is originally cast by conventional methods and is then machined by standard techniques to form the finely pitched posts 45. In one successful embodiment of the invention, the finely pitched posts 45 had a thickness of 0.18 millimeters, with a slot region of 0.53 millimeters between each post. The fan-frame member 25 is preferably formed from a reasonably heat conductive material, such as plastic, aluminum, or zinc. In one successful embodiment of the invention, a tube axial fan 28 with a rotational blade diameter of 38 millimeters is used. Such a fan may operate at approximately 6000 rpms and consume approximately 0.8 watts. The total depth of the fan body 20 is preferably less than 13 millimeters. The horizontal dimensions of the fan body 20 are preferably proportional to the microprocessor, power supply, or other heat generating device with which it is used.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

I claim:

1. A cooling apparatus for an electronic device, comprising:
   an air movement device with a plurality of blades, said blades being circumferentially formed around a central axis, said blades establishing an axial blade depth region defined in reference to said central axis; and
   a heat transfer body, including
      means for supporting said air movement device
      a pressure differential surface formed around the outer perimeter of said air movement device within a first portion of said axial blade depth region;
      an interface surface for coupling to said electronic device; and
      a heat transfer surface disposed between said supporting means and said interface surface, said heat transfer surface being formed around said air movement device within a second portion of said axial blade depth region.

2. The apparatus of claim 1 further comprising:
   a plurality of heat path posts disposed between said supporting means and said interface surface within said second portion of said axial blade depth region.

3. The apparatus of claim 1 wherein said heat transfer surface includes a plurality of heat transfer surface members defining a corresponding plurality of slots therebetween.

4. The apparatus of claim 1 wherein said interface surface is a perimeter interface surface.

5. The apparatus of claim 1 wherein said pressure differential surface is formed within said supporting means.

6. The apparatus of claim 1 wherein said pressure differential surface is coupled to said supporting means.

7. A cooling apparatus for an electronic device, comprising:
   an air movement device formed around a central axis, said air movement device defining a device depth region in reference to said central axis; and
   a heat transfer body, including
      a pressure differential surface formed around the outer perimeter of said air movement device within a first portion of said device depth region,
      a frame for supporting said air movement device, said frame forming at least a portion of said pressure differential surface, and
      a heat transfer surface, coupled to said pressure differential surface, formed around said air movement device within a second portion of said device depth region, said cooling apparatus forcing air movement along said central axis.

8. The apparatus of claim 7 further comprising:
   a plurality of heat path posts positioned within said device depth region.

9. The apparatus of claim 7 wherein said heat transfer surface includes a plurality of heat transfer surface members defining a corresponding plurality of slots therebetween.

10. The apparatus of claim 7 wherein said interface surface is a perimeter interface surface.

11. An apparatus for removing heat from a heat generating surface, comprising:
   an air movement device formed around a central axis, said air movement device defining a device depth region in reference to said central axis; and
   a heat transfer body, including
      an interface surface for coupling to said heat generating surface,
      a pressure differential surface formed around the outer perimeter of said air movement device within a first portion of said device depth region,
      a frame for supporting said air movement device, said frame forming at least a portion of said pressure differential surface, and
      a plurality of heat paths, positioned between said frame and said interface surface, within a second portion of said device depth region.

12. The apparatus of claim 11 further comprising:
   a plurality of heat transfer surfaces positioned between said plurality of heat transfer paths.

13. The apparatus of claim 12 wherein each of said heat transfer surfaces includes a plurality of heat transfer surface members defining a corresponding plurality of slots therebetween.

14. The apparatus of claim 11 wherein said interface surface is a perimeter interface surface.

15. A device for cooling an electronic component having an exposed surface, said device comprising:
   a heat transfer body adapted to be engaged with said surface, said body having
      an airflow passageway adapted to receive and discharge cooling air to cool said surface, and
      heat transfer means positioned in said air flow passageway to enhance the heat transfer capacity of said heat transfer body; and
   a means for moving air disposed in said passageway to create an air flow therethrough;
   said heat transfer body and said air moving means having substantially equal dimensions in a direction normal to said surface.

16. The device of claim 15 wherein:
   said air moving means is formed around a central axis and defines a device depth region in reference to said central axis; and
   said heat transfer body includes
      a base member for supporting said air moving means, said base member including said heat transfer means, said heat transfer means being formed around the outer perimeter of said air moving means within a first portion of said device depth region, and
      a pressure differential surface, coupled to said base member, formed around the outer perimeter of said air moving means within a second portion of said device depth region.

17. The device of claim 16 wherein said base member includes heat path posts within said first portion of said device depth region.

18. The device of claim 16 wherein said heat transfer means includes a plurality of heat transfer members defining a corresponding plurality of slots therebetween.

19. The device of claim 16 wherein said base member includes an interface surface for coupling to said exposed surface.

20. The device of claim 15 wherein
   said air moving means is formed around a central axis and defines a device depth region in reference to said central axis; and
   said heat transfer body includes
      an interface surface for coupling to said exposed surface, said interface surface including means for supporting said air moving means, a plurality of heat path posts vertically extending from said interface surface into said device depth region, and said heat transfer means supported by said heat path posts, said heat transfer means forming a surface substantially parallel to said interface surface.

21. The device of claim 20 wherein said heat transfer means includes a plurality of heat conduction channels converging into a central heat conduction region.

22. The device of claim 21 wherein said heat path posts are aligned with said heat conduction channels of said heat transfer surface.

23. The device of claim 20 wherein said heat transfer means includes a plurality of heat transfer members formed between each of said heat conduction channels.

24. The device of claim 20 wherein said heat transfer means extends into said axial blade depth region.

25. The device of claim 15 wherein:

said air moving means includes a plurality of blades, said blades being circumferentially formed around a central axis, said blades establishing an axial blade depth region defined in reference to said central axis, said axial blade depth region including a first axial blade depth region and a second axial blade depth region;

said heat transfer body includes a support device for holding said air moving means such that said first axial blade depth region is within said support device; and said heat transfer means are formed around the outer perimeter of said air movement means within said second axial blade depth region.

26. The device of claim 25 further including heat path posts formed within said heat transfer body within said non-extending region.

27. The device of claim 25 wherein said heat transfer means includes a plurality of heat transfer members defining a corresponding plurality of slots therebetween.

28. The device of claim 15 wherein:

said air moving means includes a plurality of blades, said blades being circumferentially formed around a central axis; and said heat transfer body includes a discontinuous axial surface formed around said air moving means, said discontinuous axial surface including a plurality of surfaces axially displaced along said central axis.

29. The device of claim 28 wherein each of said plurality of surfaces is supported by a plurality of studs.

30. The device of claim 29 wherein said heat transfer body includes a substantially horizontal interface surface for coupling to said exposed surface, said interface surface supporting said plurality of studs.

31. The device of claim 28 wherein said interface surface includes means for supporting said air movement device.

32. The device of claim 28 wherein each of said plurality of surfaces of said axial surface is annular.

33. The device of claim 32 wherein each of said annular surfaces has a substantially arc-like cross-section.

34. The device of claim 15 wherein:

said air movement means is formed around a central axis, said air movement means defining a device depth region in reference to said central axis; and said heat transfer body includes a plurality of vertically displaced circular members forming a discontinuous heat transfer surface around said air movement device along said device depth region, and a plurality of heat transfer structures extending along said device depth region, said heat transfer structures supporting said discontinuous heat transfer surface.

35. The device of claim 34 wherein said heat transfer body further includes a substantially horizontal interface surface for coupling to said exposed surface, said interface surface supporting said plurality of heat transfer structures.

36. The apparatus of claim 35 wherein said interface surface includes means for supporting said air movement means.

37. The apparatus of claim 34 wherein each of said circular members has a substantially arc-like cross-section.

* * * * *